(12) United States Patent
Nagakura

(10) Patent No.: US 12,431,206 B2
(45) Date of Patent: Sep. 30, 2025

(54) POWER AMPLIFIER CIRCUIT

(71) Applicant: Murata Manufacturing Co., Ltd., Kyoto (JP)

(72) Inventor: Terukazu Nagakura, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 196 days.

(21) Appl. No.: 18/327,343

(22) Filed: Jun. 1, 2023

(65) Prior Publication Data

US 2023/0317189 A1   Oct. 5, 2023

Related U.S. Application Data

(63) Continuation of application No. PCT/JP2021/040247, filed on Nov. 1, 2021.

(30) Foreign Application Priority Data

Dec. 2, 2020  (JP) ................. 2020-200228

(51) Int. Cl.
*G11C 16/04* (2006.01)
*G11C 17/16* (2006.01)
(Continued)

(52) U.S. Cl.
CPC ............ *G11C 17/18* (2013.01); *G11C 17/165* (2013.01); *H03F 1/0222* (2013.01); *H03F 3/245* (2013.01)

(58) Field of Classification Search
CPC ..... G11C 17/18; G11C 17/165; H03F 1/0222; H03F 3/245
See application file for complete search history.

(56) References Cited

U.S. PATENT DOCUMENTS 7,460,380 B2 * 12/2008 Yang ................. H02M 3/33507
                                          363/16
7,629,812 B2 * 12/2009 Thummalapally ..........................
                                          H03K 19/1778
                                          326/38
(Continued)

FOREIGN PATENT DOCUMENTS

| JP | 2001-319499 A | 11/2001 |
| JP | 2012-174283 A | 9/2012 |
| JP | 2013-114726 A | 6/2013 |

OTHER PUBLICATIONS

International Search Report for PCT/JP2021/040247 dated Dec. 21, 2021.

*Primary Examiner* — Pho M Luu
(74) *Attorney, Agent, or Firm* — McDonald Hopkins LLC

(57) ABSTRACT

A storage element is connected in series between the ground and a power supply terminal supplied with a power-supply voltage. A first transistor is connected in series to the storage element between the power supply terminal and the ground. A first control circuit supplies the gate of the first transistor with a first control voltage through the storage element. When the power-supply voltage has a voltage value for changing the resistance value of the storage element, the first control circuit supplies the gate of the first transistor with the first control voltage having a first voltage value. When the power-supply voltage has a voltage value for reading out the resistance value of the storage element, the first control circuit supplies the gate of the first transistor with the first control voltage having a second voltage value whose absolute value is greater than that of the first voltage value.

8 Claims, 11 Drawing Sheets

(51) Int. Cl.
*G11C 17/18* (2006.01)
*H03F 1/02* (2006.01)
*H03F 3/24* (2006.01)

(56) References Cited

U.S. PATENT DOCUMENTS

| | | | |
|---|---|---|---|
| 8,638,077 B2* | 1/2014 | Saphon | H02M 3/156 |
| | | | 323/282 |
| 8,767,417 B2* | 7/2014 | Lin | H02M 3/3353 |
| | | | 363/21.12 |
| 2001/0052633 A1 | 12/2001 | Oikawa | |
| 2012/0213014 A1 | 8/2012 | Koyashiki et al. | |

* cited by examiner

POWER AMPLIFIER CIRCUIT

CROSS REFERENCE TO RELATED APPLICATION

This is a continuation of International Application No. PCT/JP2021/040247 filed on Nov. 1, 2021 which claims priority from Japanese Patent Application No. 2020-200228 filed on Dec. 2, 2020. The contents of these applications are incorporated herein by reference in their entireties.

BACKGROUND ART

Technical Field

The present disclosure relates to a semiconductor device and a control circuit which control a current passing through an electrically write-once storage element.

Recently, for example, in RAM (Random Access Memory) circuits, electrical fuse elements may be used, for example, in redundant processing for remedying defective bits, or for identification numbers for identifying the chips. The electrical fuse elements are electrically write-once storage elements (hereinafter referred to as OTP (One Time Programming) elements). Such a storage element is connected to a terminal, which is supplied with a predetermined write voltage, and to a transistor which controls energization of the storage element. When the storage element is supplied with the predetermined write voltage, the write transistor enters the ON state due to a write control signal and a passing current flows through the storage element. The passing current causes the fuse to blow, and the storage element enters the written state. That is, if an unintentional current, other than the passing current for writing, flows through the storage element, the storage element undergoes erroneous writing. In addition, to check the written state of the storage element after writing to the storage element, a different circuit, which generates a passing current for reading the resistance value, needs to be provided.

Patent Document 1: Japanese Unexamined Patent Application Publication No. 2012-174283

BRIEF SUMMARY

The control circuit according to Patent Document 1 includes a controller which controls writing to an electrically write-once storage element in accordance with a write signal. The controller detects a write voltage supplied to the storage element. When the write voltage is greater than or equal to a predetermined threshold voltage, the controller stops writing to the storage element regardless of the write signal. Thus, the control circuit may suppress occurrence of erroneous writing to the electrically write-once storage element.

However, although Patent Document 1 discloses the configuration which suppresses occurrence of erroneous writing when an overvoltage is supplied to a storage element, the control circuit according to Patent Document 1 may fail to suppress occurrence of erroneous writing in supply of an overcurrent. In addition, in Patent Document 1, a different circuit for checking the written state of a storage element after writing to the storage element is necessary, which may cause an increase in size of the circuit.

The present disclosure provides a semiconductor device including a control circuit which adjusts a passing current in writing to a storage element and a passing current in reading out the resistance value of the storage element, in accordance with a voltage supplied to the storage element.

A semiconductor device according to an aspect of the present disclosure includes a storage element that is connected in series between the ground and a power supply terminal supplied with a power-supply voltage, a first transistor that is connected in series to the storage element, between the power supply terminal and the ground, and a first control circuit that supplies the gate of the first transistor with a first control voltage for flowing a current through the storage element. When the power-supply voltage has a voltage value for changing the resistance value of the storage element, the first control circuit supplies the gate of the first transistor with the first control voltage having a first voltage value. When the power-supply voltage has a voltage value for reading out the resistance value of the storage element, the first control circuit supplies the gate of the first transistor with the first control voltage having a second voltage value whose absolute value is greater than that of the first voltage value.

A control circuit according to an aspect of the present disclosure supplies a control voltage with the gate of a first transistor connected in series to a storage element connected in series between the ground and a power supply terminal supplied with a power-supply voltage. The control voltage is used to flow a current through the storage element. When the power-supply voltage supplied from the power supply terminal has a voltage value for changing the resistance value of the storage element, the control circuit supplies the gate of the first transistor with the control voltage having a first voltage value. When the power-supply voltage has a voltage value for reading out the resistance value of the storage element, the control circuit supplies the gate of the first transistor with the control voltage having a second voltage value whose absolute value is greater than that of the first voltage value.

The present disclosure may provide a semiconductor device including a control circuit which adjusts a passing current in writing to a storage element and a passing current in reading out the resistance value of the storage element, in accordance with a voltage supplied to the storage element.

DETAILED DESCRIPTION

===Semiconductor Device 10 According to First Embodiment===
<<Configuration>>

Figure 1:
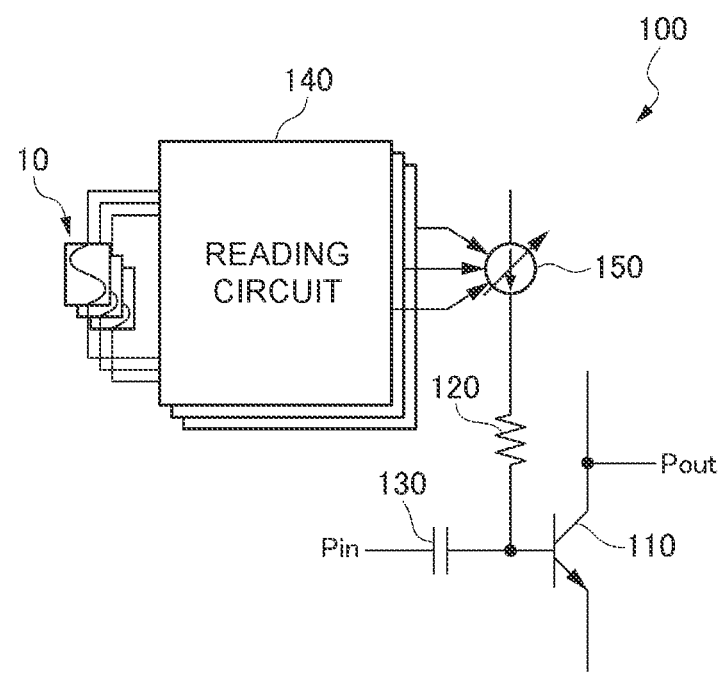
FIG. 1 is a diagram illustrating an exemplary configuration of an amplifier circuit including semiconductor devices according to a first embodiment.
Figure 2:
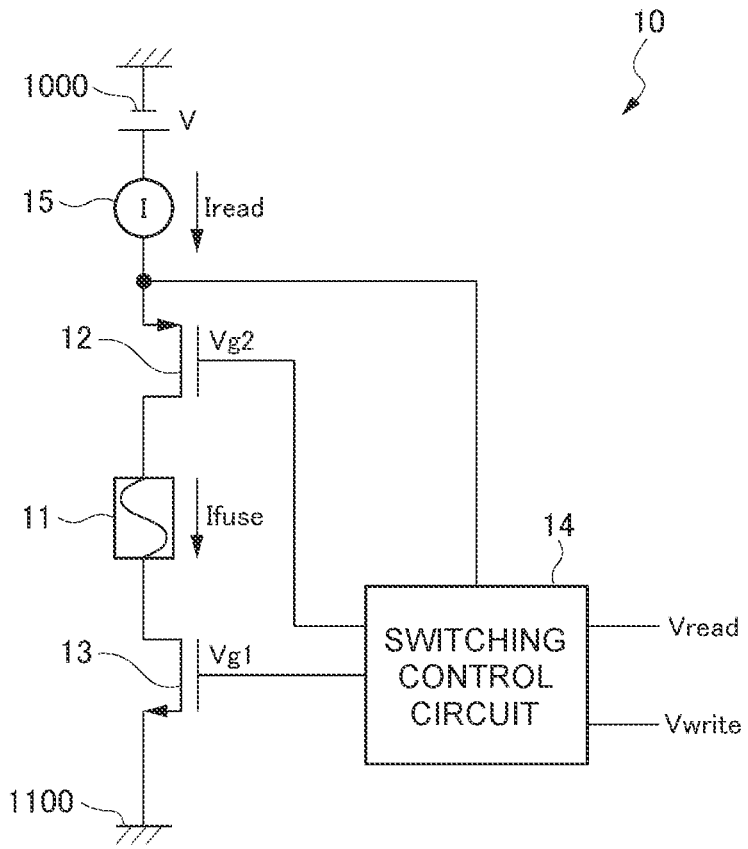
FIG. 2 is a diagram illustrating an exemplary configuration of a semiconductor device according to the first embodiment.

Referring to FIGS. 1 and 2, an exemplary configuration of a semiconductor device 10 according to a first embodiment will be described. FIG. 1 is a diagram illustrating an exemplary configuration of an amplifier circuit 100 including semiconductor devices 10 according to the first embodiment. FIG. 2 is a diagram illustrating an exemplary configuration of a semiconductor device 10 according to the first embodiment.

For example, the amplifier circuit 100, which is included in a mobile communication device such as a cellular phone, amplifies the power of an input signal Pin to a level suitable for transmission to a base station, and outputs the amplified signal as an output signal Pout. As illustrated in FIG. 1, the amplifier circuit 100 includes, for example, an amplifier element 110, a resistor 120, a capacitor 130, reading circuits 140, and a current-source circuit unit 150. The amplifier element 110 is, for example, a transistor which amplifies the input signal Pin, which is received through the capacitor 130, to the output signal Pout. The capacitor 130 is, for example, a capacitor for cutting direct-current components. For example, the reading circuits 140 read setting values from the multiple semiconductor devices 10. For example, the current-source circuit unit 150 adjusts the bias current value in accordance with the setting values of the semiconductor devices 10 which are read by the reading circuits 140.

A semiconductor device 10 illustrated in FIG. 2 has, for example, an electrically write-once storage function. The semiconductor device 10 is connected, for example, to a power supply 1000 supplying a voltage for energization to a storage element 11. As illustrated in FIG. 2, the semiconductor device 10 includes, for example, the storage element 11, a power-supply-side transistor 12, a ground-side transistor 13, a switching control circuit 14, and a current detecting unit 15. For convenience's sake, changing the resistance value of the storage element 11 is also referred to as "writing to the storage element 11"; reading out the resistance value of the storage element 11 is also referred to as "reading the resistance value of the storage element 11".

The storage element 11 (electronic storage) is, for example, a fuse element whose current path is cut off depending on its passing current. Alternatively, the storage element 11 may be, for example, an OTP element which enters the written state in such a manner that a high voltage supplied to the gate oxidation film of the transistor causes the gate oxidation film to be broken electrically. Alternatively, the storage element 11 may be, for example, an element which includes a silicide layer formed on a polysilicon layer, or a metal fuse.

The power-supply-side transistor 12 is, for example, a p-channel MOSFET (Metal-Oxide Semiconductor Field Effect Transistor). The power-supply-side transistor 12 is, for example, connected in series between the power supply 1000 and the storage element 11. Specifically, the source of the power-supply-side transistor 12 is connected to the power supply 1000, for example, through the current detecting unit 15 described below. The drain of the power-supply-side transistor 12 is connected, for example, to a first end of the storage element 11. For example, the power-supply-side transistor 12 controls the energization time of a current (hereinafter referred to as a "passing current"), which flows through the storage element 11, on the basis of a control voltage received from the switching control circuit 14. The control voltage received at the gate of the power-supply-side transistor 12 may be supplied from a circuit (not illustrated) different from the switching control circuit 14.

The ground-side transistor 13 is, for example, an n-channel MOSFET. The ground-side transistor 13 is connected, for example, in series between a second end of the storage element 11 and the ground 1100. Specifically, the source of the ground-side transistor 13 is connected, for example, to the ground 1100. The drain of the ground-side transistor 13 is connected, for example, to the second end of the storage element 11. For example, the ground-side transistor 13 controls the magnitude of a passing current, which flows through the storage element 11, on the basis of a control voltage supplied to the gate from the switching control circuit 14.

For example, the switching control circuit 14 supplies the gate of the ground-side transistor 13 with the control voltage for flowing a predetermined passing current through the storage element 11. For example, when the voltage (hereinafter referred to as the "control power-supply voltage") supplied from the power supply 1000 has a voltage value indicating writing to the storage element 11, the switching control circuit 14 supplies the control voltage (hereinafter referred to as the "write control voltage") having a first voltage value. The control power-supply voltage may be, for example, the voltage applied to the source of the power-supply-side transistor 12. For example, when the control power-supply voltage has a voltage value indicating reading the resistance value of the storage element 11, the switching control circuit 14 supplies the control voltage (hereinafter referred to as the "read control voltage") having a second voltage value whose absolute value is greater than that of the first voltage value.

For example, the switching control circuit 14 may supply the gate of the power-supply-side transistor 12 with the control voltage for controlling the time interval for which a predetermined passing current flows through the storage element 11. For example, in accordance with the control power-supply voltage, in writing to the storage element 11, the switching control circuit 14 may supply a control voltage (hereinafter referred to as a "short-time ON control voltage") which has a predetermined voltage value and which is used to cause the power-supply-side transistor 12 to be ON just for a predetermined time interval. For example, in accordance with the control power-supply voltage, in reading the resistance value of the storage element 11, the switching control circuit 14 may supply a control voltage (hereinafter referred to as a "long-time ON control voltage") which has a predetermined voltage value and which is used to continue the power-supply-side transistor 12 in the ON state for a predetermined time.

Overview of the switching control circuit 14's role in the semiconductor device 10 will be described. In the semiconductor device 10, for example, the values of the passing current and the control power-supply voltage of the storage element 11 are defined for writing to the storage element 11 and reading the resistance value of the storage element 11. The value of the passing current is equal to the value obtained by dividing the control power-supply voltage by the sum of the resistance value of the storage element 11 and those of the transistors 12 and 13. Therefore, when the magnitude of the control voltage supplied to the gate of the power-supply-side transistor 12 is constant (the resistance in the ON state is constant), the switching control circuit 14 adjusts the resistance (hereinafter referred to as the "ground-side ON resistance"), which is obtained when the ground-side transistor 13 is in the ON state, so that reading the resistance value of the storage element 11 is allowed to be performed. Specifically, in writing to the storage element 11, the switching control circuit 14 supplies the gate of the ground-side transistor 13 with the write control voltage (for example, a voltage close to 0 V) which increases the ground-side ON resistance (in this example, the ground-side ON resistance is about tens to hundreds of ohms). In reading the resistance value of the storage element 11, the switching control circuit 14 supplies the gate of the ground-side transistor 13 with the read control voltage (for example, a voltage close to the power-supply voltage Vdd), which makes the ground-side ON resistance (in this example, the ground-side ON resistance is about 10Ω) less than the ON resistance used in writing to the storage element 11, so as not to produce an influence on detection of the resistance value of the storage element 11.

That is, for example, the switching control circuit 14 automatically adjusts the control voltage, which is supplied to the gate of the ground-side transistor 13, in accordance with the control power-supply voltage. Thus, the ON resistance (in this example, the ground-side ON resistance) of the MOSFET is changed to adjust the passing current of the storage element 11.

Thus, in accordance with the control power-supply voltage supplied to the storage element 11, the semiconductor device 10 may adjust the passing current used in writing to the storage element 11 and the passing current used in reading out the resistance value of the storage element 11. Therefore, the semiconductor device 10 may implement, by using a single circuit, writing to the storage element 11 and reading the resistance value of the storage element 11, achieving a reduction in size of the circuit. In addition, the semiconductor device 10 sets the ground-side ON resistance high in writing to the storage element 11 to adjust the passing current, achieving prevention of erroneous writing to the storage element 11. In addition, the semiconductor device 10 sets the ground-side ON resistance low in reading the resistance value of the storage element 11 to adjust the passing current so that the resistance value of the storage element 11 may be detected, achieving a reduction of an influence on detection of the resistance value.

Figure 3:
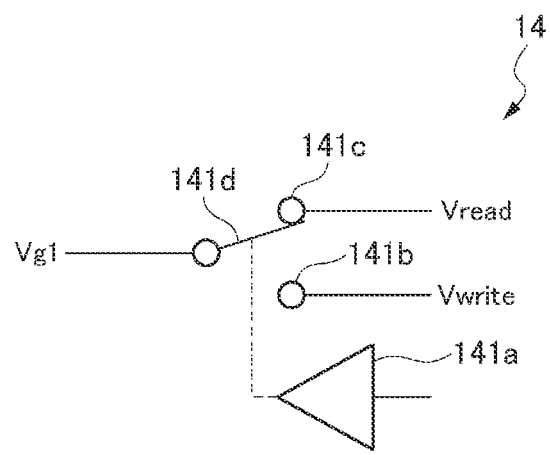
FIG. 3 is a diagram illustrating an exemplary configuration of a switching control circuit.
Figure 4:
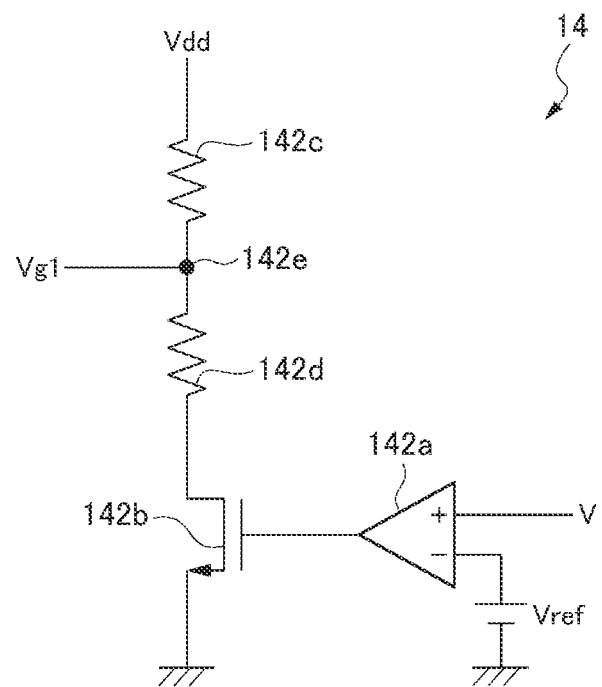
FIG. 4 is a diagram illustrating an exemplary configuration of a switching control circuit.
Figure 5:
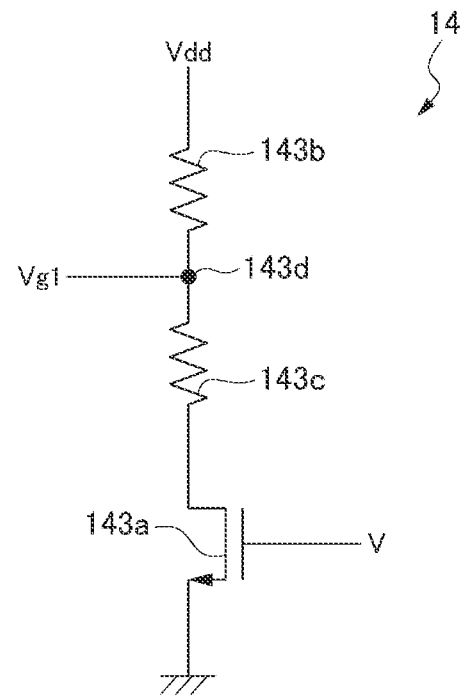
FIG. 5 is a diagram illustrating an exemplary configuration of a switching control circuit.

Referring to FIGS. 3 to 5, exemplary specific configurations of the switching control circuit 14 will be described. FIGS. 3 to 5 are diagrams illustrating exemplary configurations of the switching control circuit 14.

As illustrated in FIG. 3, the switching control circuit 14 may include, for example, a buffer element 141*a* that shapes an input signal from the control power-supply voltage, and a switch 141*d* which switches between a first terminal 141*b* that is supplied with the write control voltage and a second terminal 141*c* that is supplied with the read control voltage. The switch 141*d* switches between the first terminal 141*b* and the second terminal 141*c* in accordance with the voltage value of the input signal.

As illustrated in FIG. 4, the switching control circuit 14 may include, for example, a comparator 142*a*, a transistor 142*b*, a first resistor 142*c*, and a second resistor 142*d*. For example, the comparator 142*a* is supplied at its first terminal with the control power-supply voltage, and is supplied at its second terminal with a reference voltage. For example, when the control power-supply voltage is greater than the power-supply voltage, a level shifter (not illustrated) may be provided at the first terminal of the comparator 142*a*. For example, the transistor 142*b* receives, at its gate, a signal which is output from the comparator 142*a*. The transistor 142*b* is supplied at its drain with the power-supply voltage Vdd through the first resistor 142*c* and the second resistor 142*d*. A node 142*e* between the first resistor 142*c* and the second resistor 142*d* is connected to the gate of the ground-side transistor 13. In the switching control circuit 14, when the control power-supply voltage is greater than the reference voltage, the transistor 142*b* is switched on and the write control voltage (for example, the voltage half the power-supply voltage Vdd) is supplied to the gate of the ground-side transistor 13. In the switching control circuit 14, when the control power-supply voltage is less than the reference voltage, the transistor 142*b* is switched off and the read control voltage (for example, the power-supply voltage Vdd) is supplied to the gate of the ground-side transistor 13.

As illustrated in FIG. 5, the switching control circuit 14 may include, for example, a transistor 143*a*, a first resistor 143*b*, and a second resistor 143*c*. For example, the transistor 143*a* is supplied at its gate with the control power-supply voltage. The transistor 143*a* is supplied at its drain with the power-supply voltage Vdd through the first resistor 143*b* and the second resistor 143*c*. A node 143*d* between the first resistor 143*b* and the second resistor 143*c* is connected to the gate of the ground-side transistor 13. In the switching control circuit 14, when the control power-supply voltage is greater than a threshold voltage Vth of the gate of the transistor 143*a*, the transistor 143*a* is switched on and the write control voltage (for example, the voltage half the power-supply voltage Vdd) is supplied to the gate of the ground-side transistor 13. In the switching control circuit 14, when the control power-supply voltage is less than the threshold voltage Vth of the gate of the transistor 143*a*, the transistor 142*b* is switched off and the read control voltage (for example, the power-supply voltage Vdd) is supplied to the gate of the ground-side transistor 13.

The semiconductor device 10 uses the switching control circuit 14 illustrated in FIGS. 3 to 5 to switch between the write control voltage and the read control voltage, which are supplied to the gate of the ground-side transistor 13, in accordance with the magnitude of the control power-supply voltage. Thus, the semiconductor device 10 may implement, with an easy circuit design and by using a single circuit, writing to the storage element 11 and reading the resistance value of the storage element 11, achieving suppression of cost for design and manufacture.

The current detecting unit 15 illustrated in FIG. 2 has, for example, a function of measuring a current at a terminal of the power supply 1000. For example, the current detecting unit 15 is connected in series between the power supply 1000 and the source of the power-supply-side transistor 12. Thus, the resistance value of the storage element 11 may be determined on the basis of the current value detected by the current detecting unit 15.

<<Operations>>

Figure 6:
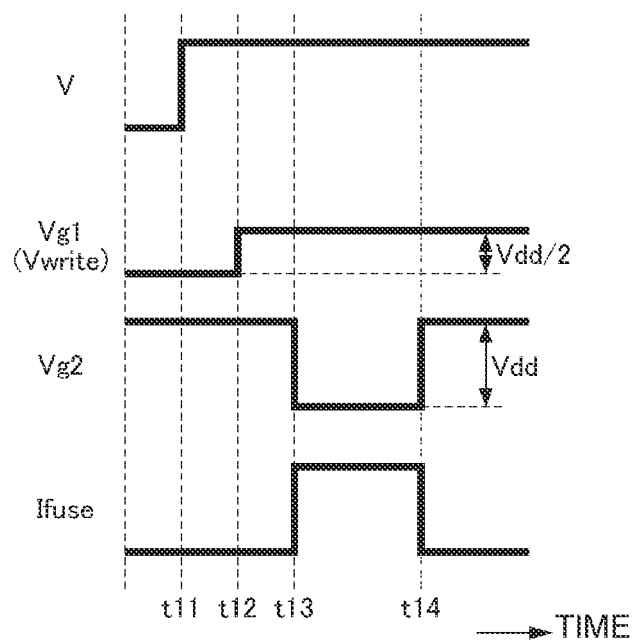
FIG. 6 is a diagram illustrating exemplary signal waveforms of units in writing to a storage element.
Figure 7:
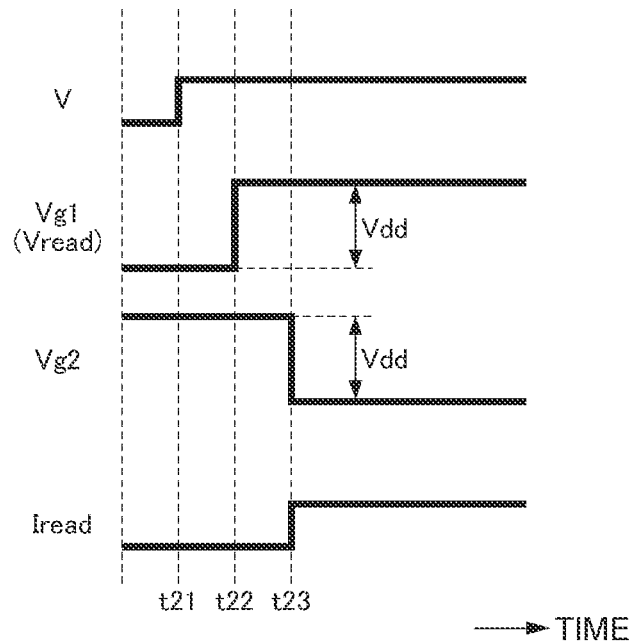
FIG. 7 is a diagram illustrating exemplary signal waveforms of units in reading the resistance value of a storage element.

Referring to FIGS. 6 and 7, exemplary operations of the semiconductor device 10 according to the first embodiment will be described. FIG. 6 is a diagram illustrating exemplary signal waveforms of units in writing to the storage element 11. FIG. 7 is a diagram illustrating exemplary signal waveforms of units in reading the resistance value of the storage element 11.

Referring to FIG. 6, operations of the semiconductor device 10 in writing to the storage element 11 will be described. As illustrated in FIG. 6, at time t11, the predefined control power-supply voltage V (for example, 5.0 V) is supplied to the source of the power-supply-side transistor 12 in writing to the storage element 11. The control power-supply voltage V is supplied to the switching control circuit 14. At time t12, the switching control circuit 14 supplies the gate of the ground-side transistor 13 with the control voltage Vg1 (which is, for example, Vdd/2, where Vdd is 3.3 V or 5.0 V, and which serves as the write control voltage) for writing to the storage element 11, on the basis of the magnitude of the control power-supply voltage V. At time t13, for example, in response to output of the control voltage Vg1, the switching control circuit 14 supplies the gate of the power-supply-side transistor 12 with the control voltage Vg2 (which is, for example, −Vdd and which serves as the short-time ON control voltage) just for a predetermined time (in this example, time t13 to time t14). From time t13 to time t14, the control voltage Vg2 is supplied to the gate of the power-supply-side transistor 12, and a passing current Ifuse flows through the storage element 11. Thus, writing to the storage element 11 is performed. The ground-side ON resistance of the ground-side transistor 13 is adjusted so that the predetermined passing current Ifuse flows for the predetermined time, achieving prevention of erroneous writing to the storage element 11. The control voltage Vg2 supplied to the gate of the power-supply-side transistor 12 may be supplied from a circuit different from the switching control circuit 14.

Referring to FIG. 7, operations of the semiconductor device 10 in reading the resistance value of the storage element 11 will be described. As illustrated in FIG. 7, at time t21, in reading the resistance value of the storage element 11, the predefined control power-supply voltage V (for example, hundreds of millivolts) is supplied to the source of the power-supply-side transistor 12. The control power-supply voltage V is supplied to the switching control circuit 14. At time t22, the switching control circuit 14 supplies the gate of the ground-side transistor 13 with the control voltage Vg1 (which is, for example, Vdd which is 3.3 V or 5.0 V, and which serves as the read control voltage) for reading the resistance value of the storage element 11, on the basis of the magnitude of the control power-supply voltage V. At time t23, for example, in response to output of the control voltage Vg1, the switching control circuit 14 supplies the gate of the power-supply-side transistor 12 with the control voltage Vg2 (which is, for example, −Vdd and which serves as the long-time ON control voltage) for a predetermined time. While the gate of the power-supply-side transistor 12 is supplied with the control voltage Vg2, a passing current Ifuse, whose magnitude does not cause writing to the storage element 11, flows through the storage element 11. The current detecting unit 15 detects a current Iread at the terminal of the power supply 1000. The semiconductor device 10 may determine the resistance value of the storage element 11 on the basis of the detected current Iread. Thus, the semiconductor device 10 may implement, by using a single circuit, writing to the storage element 11 and reading the resistance value of the storage element 11, achieving a reduction in size of the circuit. In addition, through adjustment of the ground-side ON resistance, the semiconductor device 10 achieves prevention of erroneous writing to the storage element 11 and a reduction of an influence on reading the resistance value of the storage element 11. The control voltage Vg2 supplied to the gate of the power-supply-side transistor 12 may be supplied from a circuit different from the switching control circuit 14.

First Modified Example

The semiconductor device 10 according to a first modified example is obtained by changing the configuration described above, in which a passing current is controlled through the switching control circuit 14's adjustment of the ON resistance of the ground-side transistor 13, to a configuration in which a passing current is controlled through adjustment of the ON resistance (hereinafter referred to as "power-supply-side ON resistance") of the power-supply-side transistor 12. Thus, the semiconductor device 10 may implement, by using a single circuit, writing to the storage element 11 and reading the resistance value of the storage element 11, achieving a reduction in size of the circuit. Through adjustment of the power-supply-side ON resistance, the semiconductor device 10 may prevent erroneous writing to the storage element 11 and may reduce an influence on reading the resistance value of the storage element 11.

Figure 8:
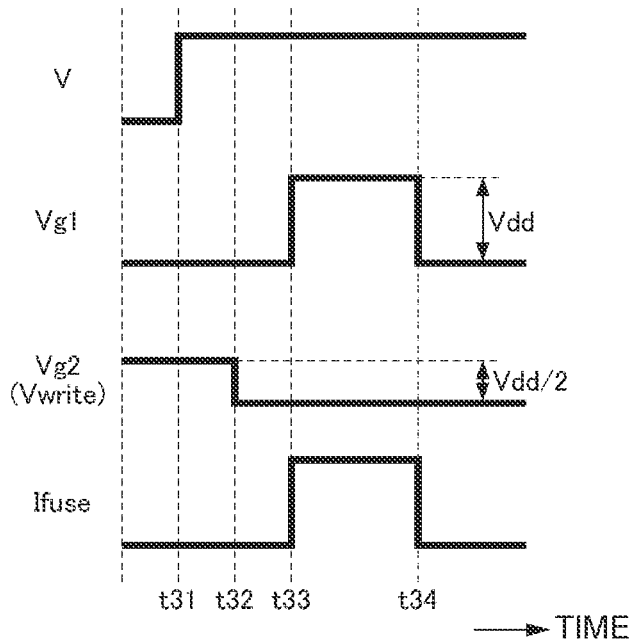
FIG. 8 is a diagram illustrating exemplary signal waveforms of units in writing to a storage element according to a first modified example.
Figure 9:
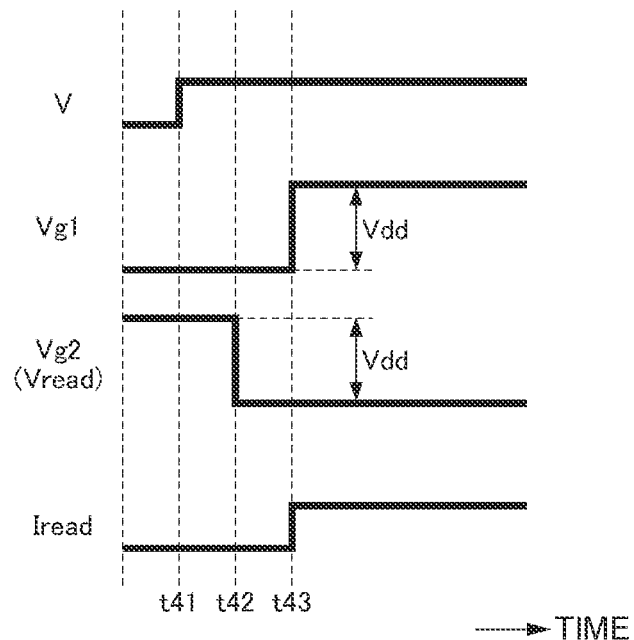
FIG. 9 is a diagram illustrating exemplary signal waveforms of units in reading the resistance value of a storage element according to the first modified example.

Referring to FIGS. 8 and 9, exemplary operations of the semiconductor device 10 according to the first modified example will be described. FIG. 8 is a diagram illustrating exemplary signal waveforms of units in writing to the storage element 11 according to the first modified example. FIG. 9 is a diagram illustrating exemplary signal waveforms of units in reading the resistance value of the storage element 11 according to the first modified example.

In FIG. 8, times t11, t12, t13, and t14 in FIG. 6 correspond to times t31, t32, t33, and t34. Specifically, at time t31, the control power-supply voltage V (for example, 5.0 V) is supplied to the source of the power-supply-side transistor 12. The control power-supply voltage V is supplied to the switching control circuit 14. At time t32, the switching control circuit 14 supplies the gate of the power-supply-side transistor 12 with the control voltage Vg2 (which is, for example, −Vdd/2, where Vdd is 3.3 V or 5.0 V, and which serves as the write control voltage) for writing to the storage element 11, on the basis of the magnitude of the control power-supply voltage V. At time t33, for example, in response to output of the control voltage Vg2, the switching control circuit 14 supplies the gate of the ground-side transistor 13 with the control voltage Vg1 (which is, for example, Vdd and which serves as the short-time ON control voltage) for a predetermined time. While the gate of the ground-side transistor 13 is supplied with the control voltage Vg1 from time t33 to time t34, a passing current Ifuse flows through the storage element 11 so that writing to the storage element 11 is performed. Thus, the ON resistance of the power-supply-side transistor 12 is adjusted so that the predetermined passing current Ifuse flows for the predetermined time, achieving prevention of erroneous writing to the storage element 11.

In FIG. 9, times t21, t22, and t23 in FIG. 7 correspond to times t41, t42, and t43. Specifically, at time t41, the control power-supply voltage V (for example, hundreds of millivolts) is supplied to the source of the power-supply-side transistor 12. The control power-supply voltage V is supplied to the switching control circuit 14. At time t42, the switching control circuit 14 supplies the gate of the power-supply-side transistor 12 with the control voltage Vg2 (which is, for example, −Vdd, where Vdd is 3.3 V or 5.0 V, and which serves as the read control voltage) for reading the resistance value of the storage element 11, on the basis of the magnitude of the control power-supply voltage V. At time t43, for example, in response to output of the control voltage Vg2, the switching control circuit 14 supplies the gate of the ground-side transistor 13 with the control voltage Vg1 (which is, for example, Vdd and which serves as the long-time ON control voltage) for a predetermined time. While the gate of the ground-side transistor 13 is supplied with the control voltage Vg1, a passing current Ifuse, whose magnitude does not cause writing to the storage element 11, flows through the storage element 11. The current detecting unit 15 detects a current Iread at the terminal of the power supply 1000. The semiconductor device 10 may determine the resistance value of the storage element 11 on the basis of the detected current Iread. Thus, the semiconductor device 10 may implement, by using a single circuit, writing to the storage element 11 and reading the resistance value of the storage element 11, achieving a reduction in size of the circuit. In addition, through adjustment of the power-supply-side ON resistance, the semiconductor device 10 achieves prevention of erroneous writing to the storage element 11 and a reduction of an influence on reading the resistance value of the storage element 11. The control voltage Vg1 supplied to the gate of the ground-side transistor 13 may be supplied from a circuit different from the switching control circuit 14.

Second Modified Example

The semiconductor device 10 according to a second modified example is obtained by changing the configuration described above, in which a time, for which a current flows through the storage element 11, is controlled through the switching control circuit 14's adjustment of a time for which a control voltage is supplied to the power-supply-side transistor 12 or the ground-side transistor 13, to a configuration in which a time, for which a current flows through the storage element 11, is controlled through adjustment of a time for which a control power-supply voltage is supplied. Thus, the switching control circuit 14 does not need a circuit for controlling a time for which a current flows through the storage element 11, achieving a reduction in size of the semiconductor device 10.

Figure 10:
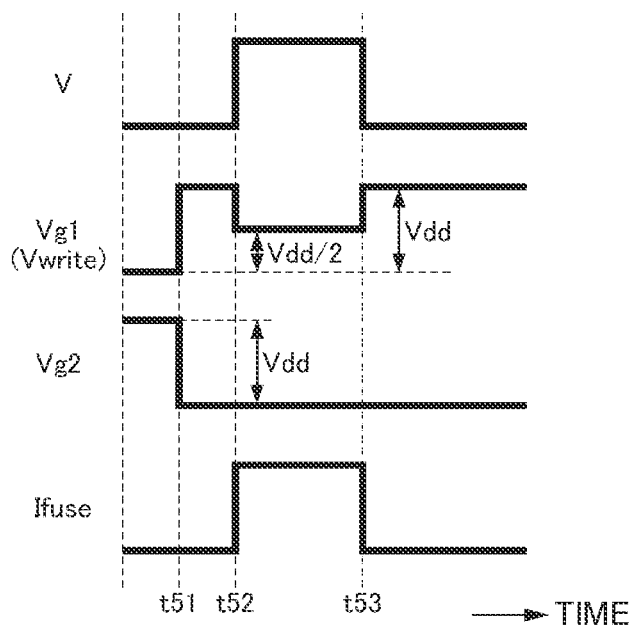
FIG. 10 is a diagram illustrating exemplary signal waveforms of units in writing to a storage element according to a second modified example.
Figure 11:
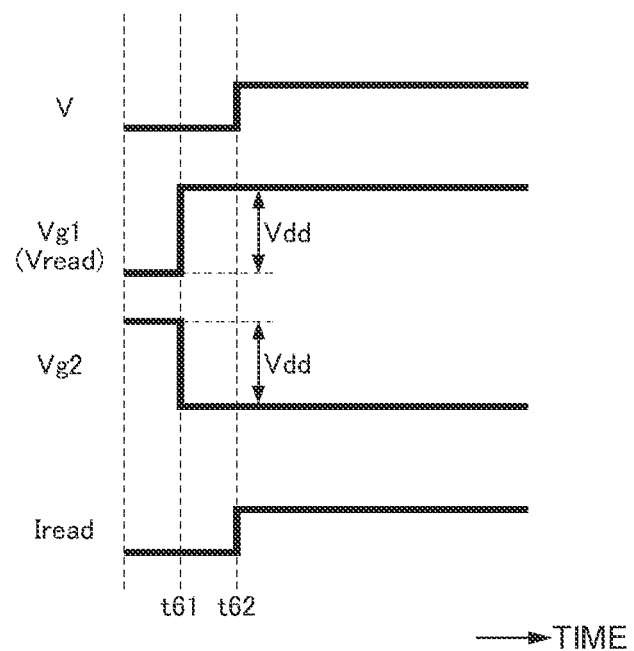
FIG. 11 is a diagram illustrating exemplary signal waveforms of units in reading the resistance value of a storage element according to the second modified example.

Referring to FIGS. 10 and 11, exemplary operations of the semiconductor device 10 according to the second modified example will be described. FIG. 10 is a diagram illustrating exemplary signal waveforms of units in writing to the storage element 11 according to the second modified example. FIG. 11 is a diagram illustrating exemplary signal waveforms of units in reading the resistance value of the storage element 11 according to the second modified example.

As illustrated in FIG. 10, at time t51, the semiconductor device 10 causes the switching control circuit 14 to supply control voltages to the ground-side transistor 13 and the power-supply-side transistor 12, on the basis of a signal indicating start of an operation of writing to the storage element 11. On the basis of the signal, the switching control circuit 14 supplies the gate of the ground-side transistor 13 with the control voltage Vg1 (which is, for example, Vdd, where Vdd is 3.3 V or 5.0 V, and which serves as the write control voltage) for writing to the storage element 11. At the same time, for example, the switching control circuit 14 supplies the gate of the power-supply-side transistor 12 with the control voltage Vg2 (for example, −Vdd). For example, the control voltage Vg1 and the control voltage Vg2 are supplied to the gates of the transistors 12 and 13, respectively, for a time longer than the time from time t52 to time t53 which are described below. At time t52, the switching control circuit 14 sets the control voltage Vg1, for example, to Vdd/2. From time t52 to time t53, the semiconductor device 10 supplies the control power-supply voltage V to the storage element 11, the power-supply-side transistor 12, and the ground-side transistor 13. That is, the semiconductor device 10 according to the second modified example may flow a passing current Ifuse, which corresponds to the magnitude of the predetermined control power-supply voltage V, for writing to the storage element 11, for a predetermined time in the specified range of the storage element 11. Thus, erroneous writing to the storage element 11 may be prevented, and an influence on reading the resistance value of the storage element 11 may be reduced.

As illustrated in FIG. 11, at time t61, the semiconductor device 10 causes the switching control circuit 14 to supply control voltages to the ground-side transistor 13 and the power-supply-side transistor 12, on the basis of a signal indicating start of an operation of reading the resistance value of the storage element 11. On the basis of the signal, the switching control circuit 14 supplies the gate of the ground-side transistor 13 with the control voltage Vg1 (which is, for example, Vdd, where Vdd is 3.3 V or 5.0 V, and which serves as the read control voltage) for reading the resistance value of the storage element 11. At the same time, for example, the switching control circuit 14 supplies the gate of the power-supply-side transistor 12 with the control voltage Vg2 (for example, −Vdd). For example, the control voltage Vg1 and the control voltage Vg2 are supplied to the gates of the transistors for a time longer than the time for which the control power-supply voltage V is ON. At time t62, the semiconductor device 10 supplies the control power-supply voltage V to the storage element 11, the power-supply-side transistor 12, and the ground-side transistor 13 for a predetermined time. That is, the semiconductor device 10 according to the second modified example may flow a current Iread, which corresponds to the magnitude of the predetermined control power-supply voltage V, for reading the resistance value of the storage element 11, for a predetermined time in the specified range of the storage element 11. Thus, the semiconductor device 10 achieves a reduction in size of the circuit, prevention of erroneous writing to the storage element 11, and a reduction of an influence on reading the resistance value of the storage element 11.

Third Modified Example

Figure 12:
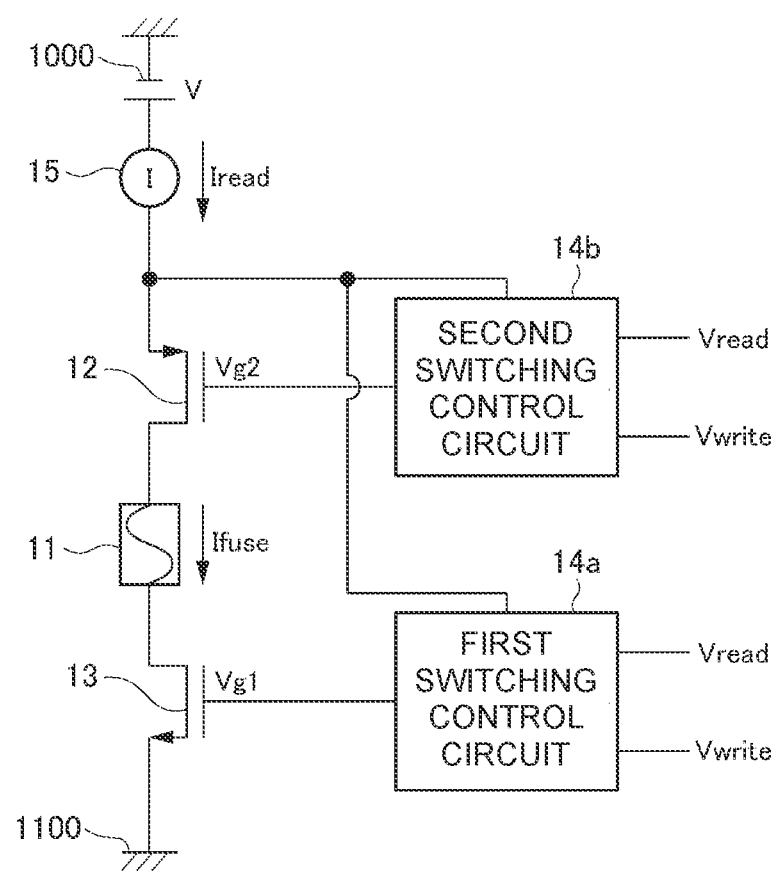
FIG. 12 is a diagram illustrating an exemplary configuration of a semiconductor device according to a third modified example.

Referring to FIG. 12, the configuration of the semiconductor device 10 according to a third modified example will be described. FIG. 12 is a diagram illustrating an exemplary configuration of the semiconductor device 10 according to the third modified example. As illustrated in FIG. 12, the semiconductor device 10 according to the third modified example is obtained by changing the configuration described above, in which the switching control circuit 14 supplies the control voltages to the power-supply-side transistor 12 and the ground-side transistor 13, to a configuration in which a first switching control circuit 14a supplies a control voltage to the ground-side transistor 13 and in which a second switching control circuit 14b supplies a control voltage to the power-supply-side transistor 12. That is, in the semiconductor device 10 according to the third modified example, the first switching control circuit 14a controls the ground-side ON resistance of the ground-side transistor 13 in accordance with the control power-supply voltage; the second switching control circuit 14b controls the ON resistance of the power-supply-side transistor 12 in accordance with the control power-supply voltage. Thus, the semiconductor device 10 may control the ON resistance of a transistor more easily in writing, and may flow a passing current Ifuse having an exact predetermined amount. Further, through adjustment of a passing current in reading, prevention of erroneous writing to the storage element 11 and a reduction of an influence on reading the resistance value of the storage element 11 are achieved.

===Semiconductor Device 20 According to Second Embodiment===

Figure 13:
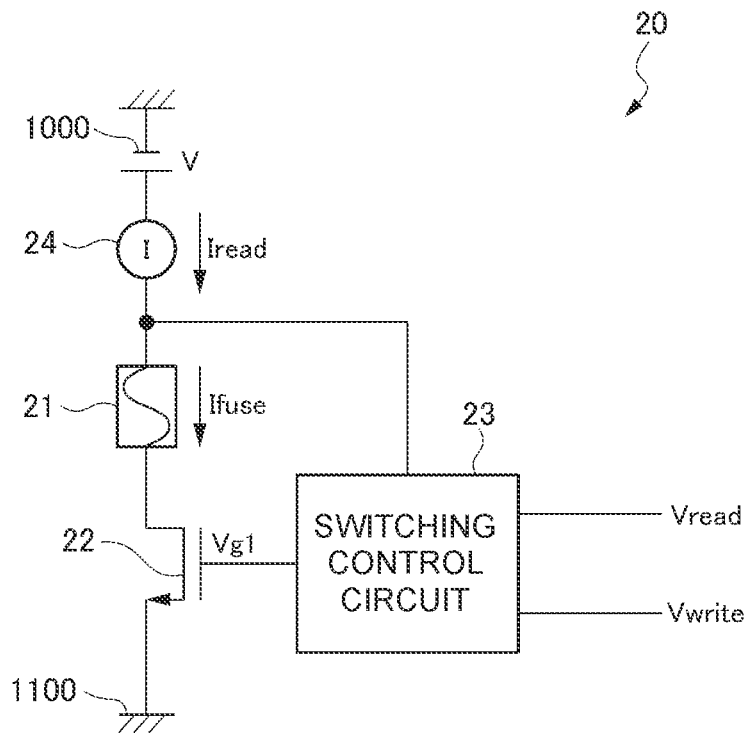
FIG. 13 is a diagram illustrating an exemplary configuration of a semiconductor device according to a second embodiment.

Referring to FIG. 13, an exemplary configuration of a semiconductor device 20 according to a second embodiment will be described. FIG. 13 is a diagram illustrating an exemplary configuration of the semiconductor device 20 according to the second embodiment. The semiconductor device 20 according to the second embodiment is a device having a configuration, without necessarily the ground-side transistor 13, of the semiconductor device 10 according to the first embodiment. That is, for example, in the semiconductor device 20, a switching control circuit 23 adjusts the ON resistance of a ground-side transistor 22, while controlling the ON time of the ground-side transistor 22. Thus, the configuration without necessarily the power-supply-side transistor 12 achieves a further reduction in size of the circuit.

As illustrated in FIG. 13, for example, the semiconductor device 20 includes a storage element 21, the ground-side transistor 22, the switching control circuit 23, and a current detecting unit 24. The storage element 21, the ground-side transistor 22, and the current detecting unit 24 are substantially the same as the storage element 11, the ground-side transistor 13, and the current detecting unit 15, and will not be described.

For example, the switching control circuit 23 supplies the gate of the ground-side transistor 22 with a control voltage for flowing a current through the storage element 21. For example, the switching control circuit 23 supplies the write control voltage in writing to the storage element 21, in accordance with the magnitude of the control power-supply voltage. For example, the switching control circuit 23 may supply the control voltage as a voltage for defining a time for which a current flows through the storage element 21.

Figure 14:
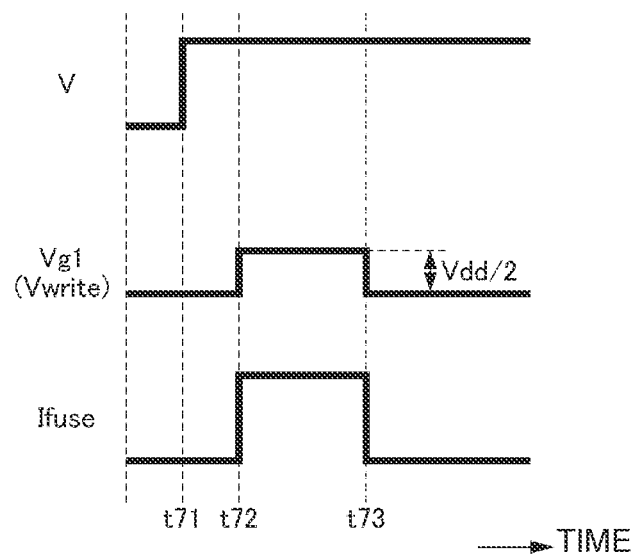
FIG. 14 is a diagram illustrating exemplary signal waveforms of units in writing to a storage element according to the second embodiment.
Figure 15:
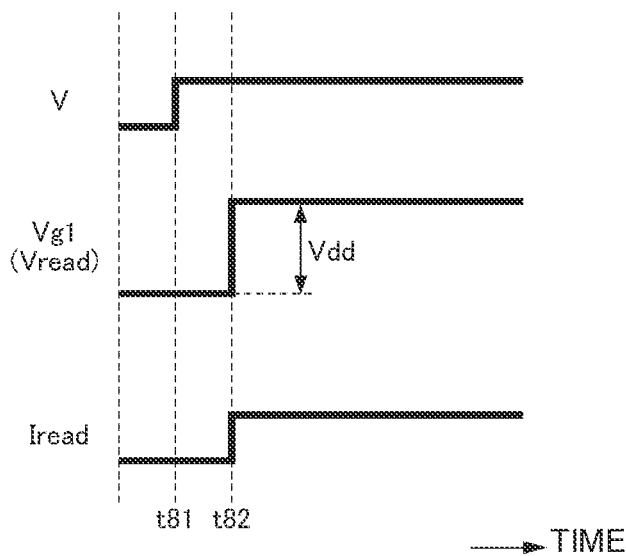
FIG. 15 is a diagram illustrating exemplary signal waveforms of units in reading the resistance value of a storage element according to the second embodiment.

Referring to FIGS. 14 and 15, exemplary operations of the semiconductor device 20 according to the second embodiment will be described. FIG. 14 is a diagram illustrating exemplary signal waveforms of units in writing to the storage element 21 according to the second embodiment. FIG. 15 is a diagram illustrating exemplary signal waveforms of units in reading the resistance value of the storage element 21 according to the second embodiment.

Referring to FIG. 14, operations of the semiconductor device 20 in writing to the storage element 21 will be described. As illustrated in FIG. 14, at time t71, the control power-supply voltage V (for example, 5.0 V) is supplied to the storage element 21 and the drain of the ground-side transistor 22. The control power-supply voltage V is supplied to the switching control circuit 23. At time t72, the switching control circuit 23 supplies the gate of the ground-side transistor 22 with the control voltage Vg1 (which is, for example, Vdd/2, where Vdd is 3.3 V or 5.0 V, and which serves as the write control voltage) for writing to the storage element 21, on the basis of the magnitude of the control power-supply voltage V. A passing current Ifuse flows through the storage element 21, and writing to the storage element 21 is thus performed. At time t73, the switching control circuit 23 stops supply of the control voltage Vg1 (for example, Vdd/2) to the gate of the ground-side transistor 22. This stops the passing current Ifuse flowing through the storage element 21. Thus, the semiconductor device 20 achieves a reduction in size of the circuit, prevention of erroneous writing to the storage element 21, and a reduction of an influence on reading the resistance value of the storage element 21.

Referring to FIG. 15, operations of the semiconductor device 20 in reading the resistance value of the storage element 21 will be described. As illustrated in FIG. 15, at time t81, the control power-supply voltage V (for example, hundreds of millivolts) defined for reading the resistance value of the storage element 21 is supplied to the storage element 21 and the drain of the ground-side transistor 22. The control power-supply voltage V is supplied to the switching control circuit 23. At time t82, the switching control circuit 23 supplies the gate of the ground-side transistor 22 with the control voltage Vg1 (which is, for example, Vdd, where Vdd is 3.3 V or 5.0 V, and which serves as the read control voltage) for reading the resistance value of the storage element 21, on the basis of the magnitude of the control power-supply voltage V. While the control voltage Vg1 is supplied, a passing current Ifuse, whose magnitude does not cause writing, flows through the storage element 21. Thus, the semiconductor device 20 achieves a reduction in size of the circuit, prevention of erroneous writing to the storage element 21, and a reduction of an influence on reading the resistance value of the storage element 21.

Modified Example

Figure 16:
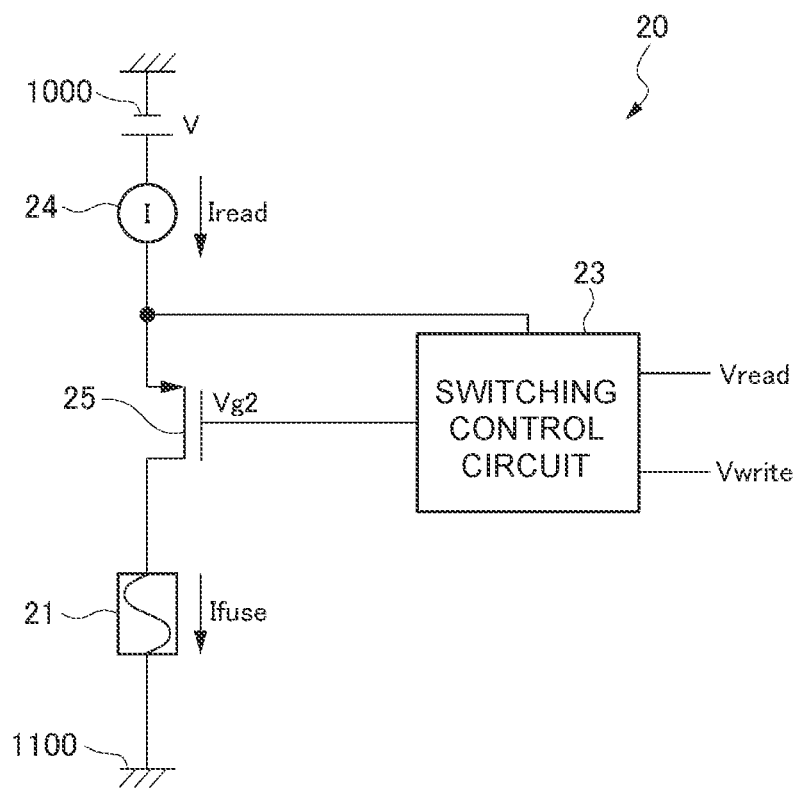
FIG. 16 is a diagram illustrating an exemplary configuration of a semiconductor device according to a modified example of the second embodiment.

Referring to FIG. 16, an exemplary configuration of the semiconductor device 20 according to a modified example of the second embodiment will be described. FIG. 16 is a diagram illustrating an exemplary configuration of the semiconductor device 20 according to the modified example of the second embodiment. As illustrated in FIG. 16, the semiconductor device 20 according to the modified example of the second embodiment has a configuration in which the ground-side transistor 22 included in the semiconductor device 20 according to the second embodiment is replaced by a power-supply-side transistor 25. The power-supply-side transistor 25 is substantially the same as the power-supply-side transistor 12 of the semiconductor device 10 according to the first embodiment, and will not be described.

Figure 17:
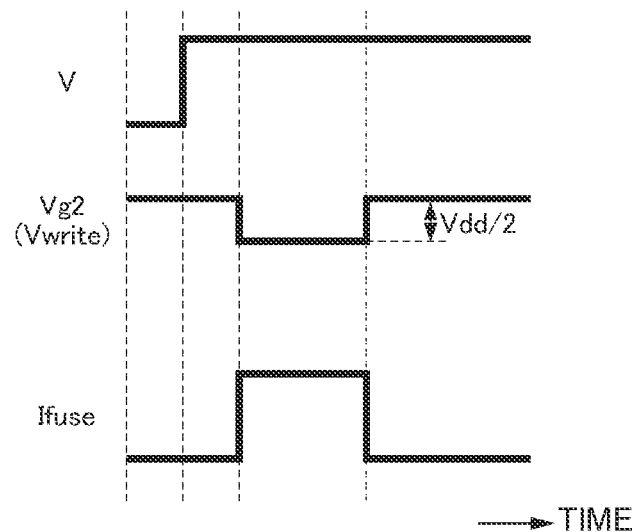
FIG. 17 is a diagram illustrating exemplary signal waveforms of units in writing to a storage element according to the modified example of the second embodiment.
Figure 18:
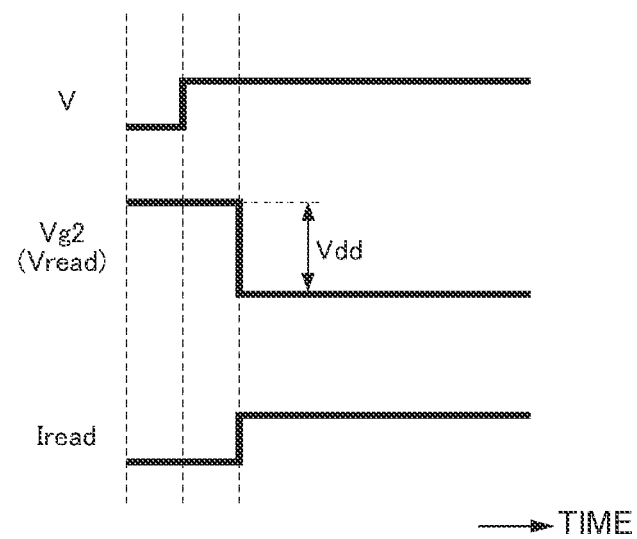
FIG. 18 is a diagram illustrating exemplary signal waveforms of units in reading the resistance value of a storage element according to the modified example of the second embodiment.

Referring to FIGS. 17 and 18, exemplary operations of the semiconductor device 20 according to the modified example of the second embodiment will be described. FIG. 17 is a diagram illustrating exemplary signal waveforms of units in writing to the storage element 21 according to the modified example of the second embodiment. FIG. 18 is a diagram illustrating exemplary signal waveforms of units in reading the resistance value of the storage element 21 according to the modified example of the second embodiment.

Referring to FIG. 17, operations of the semiconductor device 20 in writing to the storage element 21 will be described. As illustrated in FIG. 17, at time t91, the control power-supply voltage V (for example, 5.0 V) is supplied to the source of the power-supply-side transistor 25. The control power-supply voltage V is supplied to the switching control circuit 23. At time t92, the switching control circuit 23 supplies the gate of the power-supply-side transistor 25 with the control voltage Vg2 (which is, for example, −Vdd/2, where Vdd is 3.3 V or 5.0 V, and which serves as the write control voltage) for writing to the storage element 21, on the basis of the magnitude of the control power-supply voltage V. A passing current Ifuse flows through the storage element 21, and writing to the storage element 21 is thus performed. At time t93, the switching control circuit 23 stops supply of the control voltage Vg2 (for example, Vdd/2) to the gate of the power-supply-side transistor 25. This stops the passing current Ifuse flowing through the storage element 21. Thus, the semiconductor device 20 achieves a reduction in size of the circuit, prevention of erroneous writing to the storage element 21, and a reduction of influence on reading the resistance value of the storage element 21.

Referring to FIG. 18, operations of the semiconductor device 20 in reading the resistance value of the storage element 21 will be described. As illustrated in FIG. 18, at time t101, the control power-supply voltage V (for example, hundreds of millivolts) defined for reading the resistance value of the storage element 21 is supplied to the source of the power-supply-side transistor 25. The control power-supply voltage V is supplied to the switching control circuit 23. At time t102, the switching control circuit 23 supplies the gate of the power-supply-side transistor 25 with the control voltage Vg2 (which is, for example, −Vdd, where Vdd is 3.3 V or 5.0 V, and which serves as the read control voltage) for reading the resistance value of the storage element 21, on the basis of the magnitude of the control power-supply voltage V. While the control voltage Vg2 is supplied, a passing current Ifuse, whose magnitude does not cause writing, flows through the storage element 21. Thus, the semiconductor device 20 achieves a reduction in size of the circuit, prevention of erroneous writing to the storage element 21, and a reduction of influence on reading the resistance value of the storage element 21.

CONCLUSION

A semiconductor device 10, 20 includes a storage element 11, 21 that is connected in series between the ground and a power supply terminal supplied with a control power-supply voltage (power-supply voltage), a power-supply-side transistor 12, 25 or a ground-side transistor 13, 22 (first transistor) that is connected in series to the storage element 11, 21, between the power supply terminal and the ground, and a switching control circuit 14, 23 (first control circuit) that supplies the gate of the power-supply-side transistor 12, 25 or the ground-side transistor 13, 22 (first transistor) with a control voltage for flowing a current through the storage element 11, 21. When the control power-supply voltage (power-supply voltage) has a voltage value for changing the resistance value of the storage element 11, 21, the switching control circuit 14, 23 (first control circuit) supplies the gate of the power-supply-side transistor 12, 25 or the ground-side transistor 13, 22 (first transistor) with a voltage (first control voltage) which is a write control voltage having a first voltage value. When the control power-supply voltage (power-supply voltage) has a voltage value for reading out the resistance value of the storage element 11, 21, the switching control circuit 14, 23 (first control circuit) supplies the gate of the power-supply-side transistor 12, 25 or the ground-side transistor 13, 22 (first transistor) with the voltage (first control voltage) which is a read control voltage having a second voltage value whose absolute value is greater than that of the first voltage value. Thus, the semiconductor device 10, 20 enables adjustment of the passing current in writing to the storage element 11, 21 and the passing current in reading out the resistance value of the storage element 11, 21, in accordance with the control power-supply voltage supplied to the storage element 11, 21. Therefore, the semiconductor device 10, 20 may implement, by using a single circuit, writing to the storage element 11, 21 and reading the resistance value of the storage element 11, 21, achieving a reduction in size of the circuit. In addition, the semiconductor device 10, 20 sets the ground-side ON resistance high in writing to the storage element 11, 21, to adjust the passing current, achieving prevention of erroneous writing to the storage element 11, 21. In addition, the semiconductor device 10, 20 sets the ground-side ON resistance low in reading the resistance value of the storage element 11, 21, to obtain, through adjustment, a passing current with which the resistance value of the storage element 11, 21 may be detected, achieving a reduction of an influence on detecting the resistance value.

In the semiconductor device 10, 20, the storage element 11, 21 is connected to the ground through the ground-side transistor 13, 22 (first transistor). This achieves prevention of erroneous writing to the storage element 11, 21 and a reduction of an influence on reading the resistance value of the storage element 11, 21.

In the semiconductor device 10, 20, the storage element 11, 21 is connected to a terminal of a power supply 1000 through the power-supply-side transistor 12, 25 (first transistor). This achieves prevention of erroneous writing to the storage element 11, 21 and a reduction of an influence on reading the resistance value of the storage element 11, 21.

In the semiconductor device 20, when the resistance value of the storage element 21 is to be changed, the switching control circuit 23 (first control circuit) supplies the gate of the ground-side transistor 22 (first transistor) with the write control voltage (first control voltage) for a predetermined time interval. Thus, the power-supply-side transistor 12 is not necessarily included, achieving a further reduction in size of the circuit.

The semiconductor device 10 further includes a power-supply-side transistor 12 (second transistor) that is connected in series to the storage element 11, between the power supply terminal and the ground. The ground-side transistor 13 (first transistor) is connected to a first terminal of the storage element 11. The power-supply-side transistor 12 (second transistor) is connected to a second terminal of the storage element 11. The switching control circuit 14 (first control circuit) supplies the gate of the power-supply-side transistor 12 (second transistor) with a control voltage (second control voltage) at a predetermined voltage for a predetermined time interval. Thus, the ground-side ON resistance of the ground-side transistor 13 is adjusted for the predetermined time to flow a predetermined passing current Ifuse, achieving prevention of erroneous writing to the storage element 11.

The semiconductor device 10 further includes a second switching control circuit 14b (second control circuit) that supplies the gate of the power-supply-side transistor 12 (second transistor) with the control voltage (second control voltage) at the predetermined voltage for the predetermined time interval, when the resistance value of the storage element 11 is to be changed. Thus, through adjustment of a passing current in reading, the semiconductor device 10 achieves prevention of erroneous writing to the storage element 11 and a reduction of an influence on reading the resistance value of the storage element 11.

The semiconductor device 10, 20 further includes a current detecting unit 15, 24 that is connected in series between the storage element 11, 21 and the power supply terminal. Thus, the resistance value of the storage element 11, 21 may be determined on the basis of the value of the passing current detected by the current detecting unit 15, 24.

A switching control circuit 14, 23 supplies a control voltage, for flowing a current through a storage element 11, 21, to the gate of a ground-side transistor 13, 22 (first transistor) that is connected in series to a storage element 11, 21 connected in series between the ground and a power supply terminal supplied with a control power-supply voltage (power-supply voltage). When the control power-supply voltage (power-supply voltage) supplied from the power supply terminal is a voltage (first control power-supply voltage with a first power-supply voltage value) for changing the resistance value of the storage element 11, 21, the switching control circuit 14, 23 supplies the gate of a power-supply-side transistor 12, 25 or the ground-side transistor 13, 22 (first transistor) with a write control voltage (control voltage) having a first voltage value. When the control power-supply voltage (power-supply voltage) is a voltage (second control power-supply voltage with a second power-supply voltage value) for reading out the resistance value of the storage element 11, 21, the switching control circuit 14, 23 supplies the gate of the power-supply-side transistor 12, 25 or the ground-side transistor 13, 22 (first transistor) with a read control voltage (control voltage) having a second voltage value whose absolute value is greater than that of the first voltage. Thus, the switching control circuit 14, 23 achieves a reduction in size of the semiconductor device 10, 20, prevention of erroneous writing to the storage element 11, 21, and a reduction of an influence on reading the resistance value of the storage element 11, 21.

The embodiments are described above to facilitate understanding of the present disclosure, not to limit the interpretation of the present disclosure. The present disclosure may be changed or improved without necessarily departing from its gist, and encompasses its equivalents. That is, modified embodiments obtained by those skilled in the art changing the design appropriately are encompassed in the scope of the present disclosure as long as the modified embodiments have the features of the present disclosure. The elements included in the embodiments, their arrangement, and the like are not limited to those illustrated and may be changed appropriately.

REFERENCE SIGNS LIST

10, 20 semiconductor device, 11, 21 storage element, 12, 25 power-supply-side transistor, 13, 22 ground-side transistor, 14 switching control circuit, 14a first switching control circuit, 14b second switching control circuit

The invention claimed is:

1. A semiconductor device comprising:

electronic storage that is connected in series between ground and a power supply terminal, the power supply terminal being supplied with a first power-supply voltage value or a second power-supply voltage value;

a first transistor that is connected in series to the electronic storage between the power supply terminal and ground; and a first control circuit configured to supply a gate of the first transistor with a first control voltage for flowing a current through the electronic storage, wherein, the first control circuit is configured to supply the gate of the first transistor with the first control voltage having a first voltage value, and the semiconductor device is configured to change a resistance value of the electronic storage, when the power-supply terminal is supplied with the first power-supply voltage value, wherein, the first control circuit is configured to supply the gate of the first transistor with the first control voltage having a second voltage value, and the semiconductor device is configured to read the resistance value of the electronic storage, when the power-supply terminal is supplied with the second power-supply voltage value, and wherein the second voltage value has an absolute value that is greater than an absolute value of the first voltage value.

2. The semiconductor device according to claim 1, wherein the electronic storage is connected to ground through the first transistor.

3. The semiconductor device according to claim 1, wherein the electronic storage is connected to the power supply terminal through the first transistor.

4. The semiconductor device according to claim 1, wherein the first control circuit is configured to supply the gate of the first transistor with the first control voltage having the first voltage value for a predetermined time interval.

5. The semiconductor device according to claim 1, further comprising:

a second transistor that is connected in series to the electronic storage between the power supply terminal and ground, wherein the first transistor is connected to a first terminal of the electronic storage, wherein the second transistor is connected to a second terminal of the electronic storage, and wherein the first control circuit is configured to supply a gate of the second transistor with a second control voltage at a predetermined voltage value for a predetermined time interval.

6. The semiconductor device according to claim 5, further comprising:

a second control circuit, wherein the second control circuit is configured to supply the gate of the second transistor with the second control voltage at the predetermined voltage value for the predetermined time interval, and the semiconductor device is configured to change the resistance value of the electronic storage, when the power-supply terminal is supplied with the first power-supply voltage value.

7. The semiconductor device according to claim 1, further comprising:
- a current detecting circuit that is connected in series between the electronic storage element and the power supply terminal.

8. A control circuit configured to:
- supply a control voltage to a gate of a first transistor connected in series to an electronic storage for flowing a current through the electronic storage, the electronic storage being connected in series between ground and a power supply terminal supplied with a first power-supply voltage value or a second power-supply voltage value,
- wherein when the power supply terminal is supplied with the first power-supply voltage, the control circuit is configured to supply the control voltage having a first voltage value, the first voltage value being configured to change a resistance value of the electronic storage, and
- wherein when the power supply terminal is supplied with the second power-supply voltage, the control circuit is configured to supply the control voltage having a second voltage value, the second voltage value being configured to read the resistance value of the electronic storage, and
- wherein the second voltage value has an absolute value that is greater than an absolute value of the first voltage value.

\* \* \* \* \*

UNITED STATES PATENT AND TRADEMARK OFFICE
CERTIFICATE OF CORRECTION

| | | |
|---|---|---|
| PATENT NO. | : 12,431,206 B2 | Page 1 of 1 |
| APPLICATION NO. | : 18/327343 | |
| DATED | : September 30, 2025 | |
| INVENTOR(S) | : Terukazu Nagakura | |

It is certified that error appears in the above-identified patent and that said Letters Patent is hereby corrected as shown below:

In the Specification

Column 4, Lines 33-34, "an re-channel MOSFET." should be --an n-channel MOSFET.--

Signed and Sealed this
Second Day of December, 2025

John A. Squires
*Director of the United States Patent and Trademark Office*